United States Patent [19]
Balistreri et al.

[11] Patent Number: 5,991,186
[45] Date of Patent: Nov. 23, 1999

[54] FOUR-BIT BLOCK WRITE FOR A WIDE INPUT/OUTPUT RANDOM ACCESS MEMORY IN A DATA PROCESSING SYSTEM

[75] Inventors: Anthony Michael Balistreri, Houston, Tex.; Richard Simpson, Carlton, United Kingdom

[73] Assignee: Texas Instruments Incorporated, Dallas, Tex.

[21] Appl. No.: 08/212,465

[22] Filed: Mar. 11, 1994

Related U.S. Application Data

[62] Division of application No. 07/676,624, Mar. 28, 1991, abandoned.

[51] Int. Cl.$^6$ .................................................. G11C 19/00
[52] U.S. Cl. ........................................ 365/78; 365/230.03
[58] Field of Search .............................. 365/78, 230.03, 365/235, 240, 189.05

[56] References Cited

U.S. PATENT DOCUMENTS

| | | | |
|---|---|---|---|
| 4,747,081 | 5/1988 | Heilveil | 365/219 |
| 4,807,189 | 2/1989 | Pinkham | 365/230.03 |
| 5,381,376 | 1/1995 | Kim | 365/230.03 |

*Primary Examiner*—A. Zarabian
*Attorney, Agent, or Firm*—Robby T. Holland; Carlton H. Hoel; Richard L. Donaldson

[57] ABSTRACT

A data processing system includes a data processor and a random access memory arranged with plural memory planes. Each memory plane includes N memory arrays; N serial registers, each serial register coupled to a memory array; N block write control circuits; a row address decoder; and a column address decoder arranged for both block decoding and individual column decoding. An address bus and a data bus connect the data processor with all of the memory arrays. Random access for writing data into the N memory arrays may be by individual bits or by blocks of bits. The plural memory planes, the address bus, and the data bus are all fabricated on a single semiconductor substrate. A Z-buffer memory with plural Z-buffer planes may also be included. Each Z-buffer plane includes N Z-buffer arrays; N Z-buffer block write control circuits; a Z-buffer row address decoder; and a Z-buffer column address decoder arranged for both block decoding and individual column decoding. The address bus and the data bus further connect the data processor with all of the Z-buffer arrays for random access writing of data by individual bits or by blocks of bits to the Z-buffer memory.

12 Claims, 8 Drawing Sheets

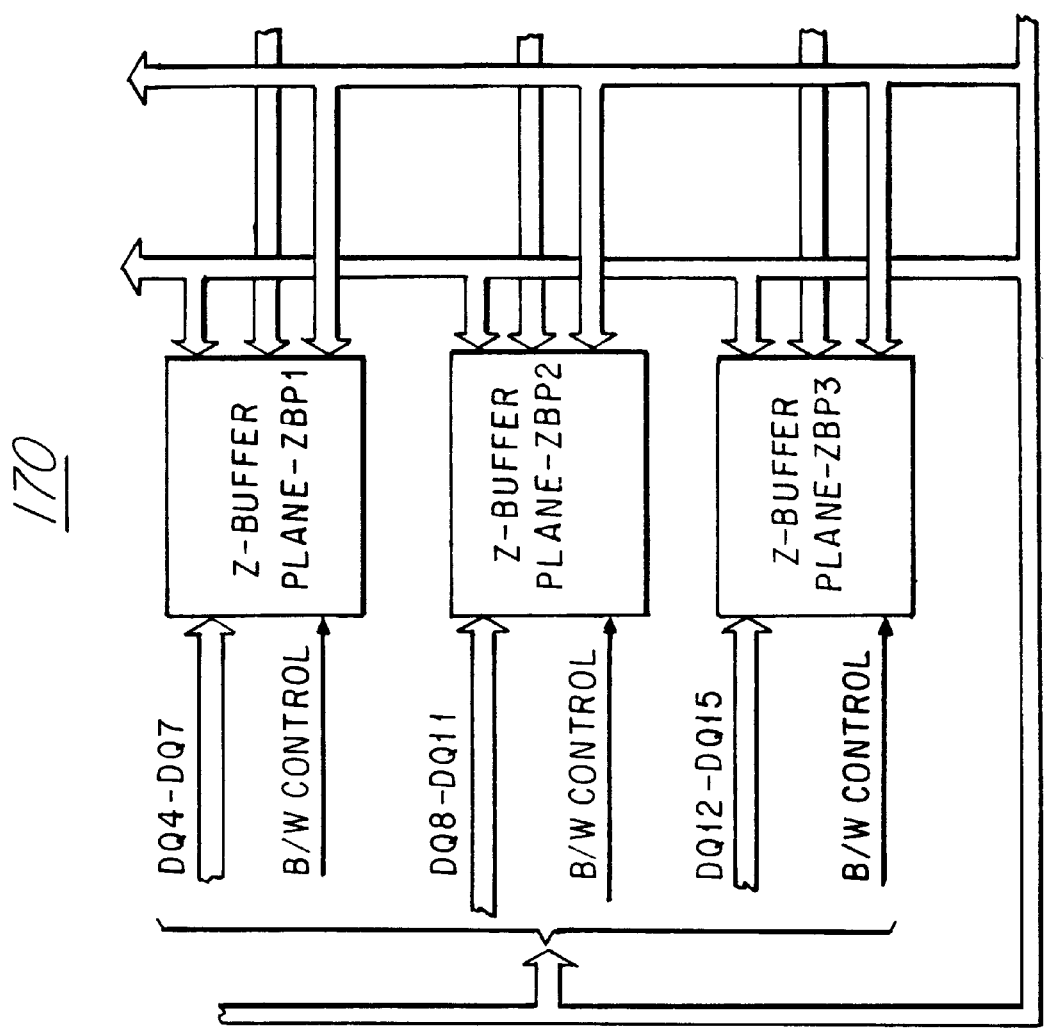

| FIG. 7 | FIG. 8 |

FOUR-BIT BLOCK WRITE FOR A WIDE INPUT/OUTPUT RANDOM ACCESS MEMORY IN A DATA PROCESSING SYSTEM

This is a division of application Serial No.07/676,624, filed Mar. 28, 1991 abandoned.

RELATED CASES

The following coassigned patent applications and patents are hereby incorporated herein by reference:

| Serial No. | Filing Date | TI Case No. |
|---|---|---|
| 07/821,641 | Jan. 23, 1986 | TI-09484 |
| 07/387,569 | Jul. 28, 1989 | TI-14315 |
| 07/563,469 | Aug. 6, 1990 | TI-14755 |
| 07/563,471 | Aug. 6, 1990 | TI-15211 |
| 07/563,472 | Aug. 6, 1990 | TI-14254 |
| U.S. Pat. No. | | |
| 4,281,401 | | TI-07928 |
| 4,639,890 | | TI-09869 |
| 4,747,081 | | TI-07970 |
| 4,807,189 | | TI-12921 |

BACKGROUND OF THE INVENTION

1. Field of the Invention

The subject invention relates to a graphics data processing system which produces a visual graphics display and more specifically to a memory arrangement for such a system.

2. Description of Related Art

In the prior art, computer systems use bit-mapped video displays to produce an image from representative data produced and stored within the system. A bit-mapped display uses a bit-mapped memory that stores at least one binary digit for each pixel of the display device. Additional digits may be stored for each pixel. Such additional digits stored for each pixel provide the capability of the system to render complex images on the video display. The use of a bit-mapped memory also allows the computer system to readily generate and modify the image to be displayed.

The display device may be of the raster-scan type wherein an electron beam carrying variations, representing image data variations, traces horizontal lines across the display screen to create the desired visual image. At the end of each horizontal line trace, the electron beam with information blacked out retraces to the origin side of the display. From there the electron beam commences another raster scan vertically off-set from the prior raster scan. By continuing this procedure, the desired image is reproduced on the display screen.

In order to increase the resolution of the displayed image, more pixels must be used in the image. The increased number of pixels must be presented to the display screen in the same amount of time because the raster operates at a fixed rate sweeping across the display screen.

Multiport random access memories have been developed for providing both high speed data output to the video display and rapid accessibility of memory contents to the data processor. The memories accomplish this by having a first port for random access to and update of the memory contents by the data processor and a second port for serial output of the memory contents to the video display. The first and second ports are asynchronous with respect to each other. Random access to the memory contents of the memory is available during data output operations to the video display.

A single memory device may include a memory plane having a plurality (such as four) of memory arrays arranged so that each array has each of its storage cells located at a column and row address which is identical with the row and column address of a storage cell in each of the other memory arrays. When data is written into any storage location, a binary digit is written simultaneously into a cell having the same address location in each of the memory arrays.

The multiple bits of information representing a single pixel may provide intensity or color information for the desired image to be displayed. Often a large number of memory addresses store identical information for the desired display. When this identical information is to be stored or refreshed in the memory plane, a block write operation may be used to accomplish the operation faster. In the block write operation, identical information is written simultaneously into a plurality of adjacent address locations. Thus several (for instance four) adjacent storage locations are written simultaneously into each memory array of the memory plane. Thus information is written simultaneously into four storage cells of each of four memory arrays. Only one random access operation is used to accomplish the block write operation. A resulting four-to-one writing speed-up is achieved.

Because of demands for increased memory capacity for data processing systems using a video display, larger video random access memories are being developed. One way to increase the capacity is to multiply the number of memory arrays in the memory plane, e.g., double from four arrays to eight arrays per memory plane or quadruple from four arrays to sixteen arrays per memory plane.

Doubling or quadrupling the number of memory arrays per memory plane creates problems for a data processing system designed for block writing into the memory device.

SUMMARY OF THE INVENTION

These and other problems are solved by a data processing system including a random access memory arranged with plural memory planes. Each memory plane includes N memory arrays; N serial registers, each serial register being coupled to a memory array; N block write control circuits; a row address decoder; and a column address decoder arranged for both block decoding and individual column decoding. An address bus and a data bus connect with all of the memory arrays. Random access write in of data to the memory arrays may be by individual bits or by blocks of bits. The plural memory planes, the address bus, and the data bus are all fabricated on a single semiconductor substrate.

BRIEF DESCRIPTION OF THE DRAWING

A more complete understanding of the invention may be gained by reading the following detailed description with reference to the drawing wherein:

FIGS. 2, 3, 4 and 5 when positioned as shown in FIG. 6 present a block diagram of circuits in a video random access memory and a Z-buffer memory;

DETAILED DESCRIPTION

Figure 1:
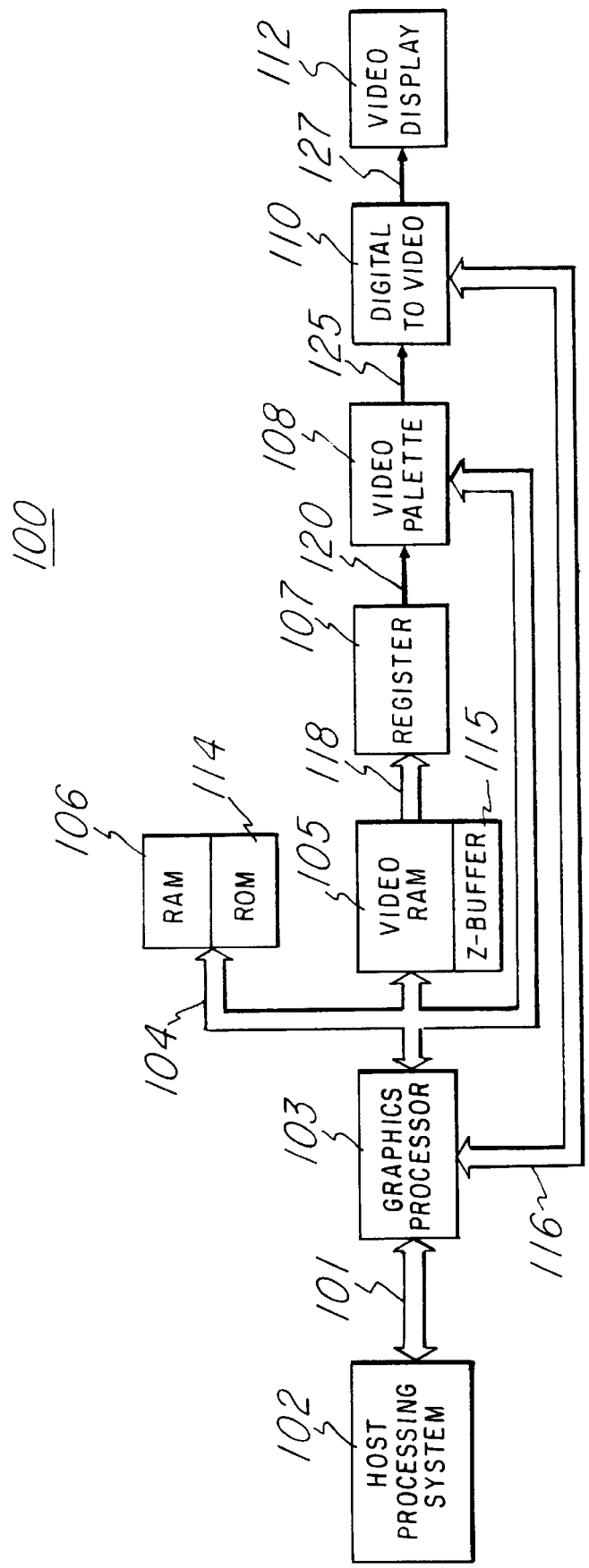
FIG. 1 is a block diagram of part of a graphics processing system.

Referring now to FIG. 1, there is shown a block diagram of a data processing system 100 including a graphics display arrangement for presenting information. A more complete description of the arrangement and operation of the system of FIG. 1 can be found in a patent application serial No. 821,641, filed Jan. 23, (TI 09848) 1986, which is incorporated herein by reference.

The data processing system 100 includes a host processing system 102, a graphics processor 103, such as a Texas Instruments TMS34010 or TMS34020 Graphics System Processor, a video random access memory (VRAM) 105 which may be for example a one megabit DRAM, a random access memory 106, a data register 107, a video palette 108, a digital to video converter 110, and a video display 112.

Host processing system 102 provides the major computational capacity for the data processing system 100. Included in the host processing system 102 are a processor, an input device, a long term storage device, a read only memory, a random access memory and assorted peripheral devices that form a computer system. Arrangement and operation of the host processing system are considered to be conventional. As a result of its processing functions, the host processing system 102 determines the information content of the graphic display to be presented on a screen for the user.

Graphics processor 103 provides the major portion of data manipulation for producing the particular graphics display to be presented on the screen. The graphics processor 103 is bi-directionally coupled to the host processing system 102 by way of a host bus 101. In the arrangement of FIG. 1, graphics processor 103 operates independently from the host processing system 102. The graphics processor 103, however, is responsive to requests from the host processing system 102. Graphics processor 103 also communicates with memory 105 and the video palette 108 by way of a memory bus 104. Data to be stored in the video random access memory 105 is controlled by the graphics processor 103. The graphics processor, in turn, may be controlled either in part or wholly by a program stored in the random access memory 106 or in a read only memory 114. Read only memory 114 may store various types of graphic image data. A Z-buffer memory 115 is arranged to store image depth information associated with each pixel stored in the video random access memory 105.

Additionally the graphics processor 103 controls data stored within the video palette 108 and by way of a video control bus 116 the operation of the digital to video converter 110. Through the digital to video converter, the graphics processor 103 can control the line length and the number of lines per frame of the video graphic image. Significantly, the graphics processor 103 determines and controls where graphic display information is stored in the video random access memory 105. Subsequently, during readout from the video random access memory 105, the graphics processor determines the readout sequence from the video random access memory and the data register 107, the addresses to be accessed, and control information required to produce the desired graphic image on the display 112.

Video random access memory 105 stores the bit mapped graphics data which define the graphics image to be presented to the user. Control of the transfer of the data from the video random access memory 105 through the data register 107, the video palette 108, and the digital to video converter 110 to the display 112 is provided by the graphics processor 103. Video data output from the video random access memory 105 is transferred by way of a video output bus 118 to the data register 107 where it is assembled into a display bit stream. The data register 107 may be a shift register.

Storage elements of the data register 107 may be fabricated of either dynamic or static electronic circuits. Alternative choices of storage elements include any bistable electronic, magnetic, optical, or optoelectronic device with sufficient operating speed.

In accordance with a typical arrangement of the video random access memory 105, there is a bank of several separate random access memory arrays. Storage cells of the video random access memory 105 may be fabricated as either dynamic or static electronic circuits. For a single readout access operation, only one bit of data is readout from a selected storage element of each of the arrays. Thus a group of bits, including one bit from each of the several separate arrays, are read out at once. The data register 107 assembles the display bit stream for transmission by way of a lead 120 to the video palette 108. Although the foregoing describes the video random access memory 105 as an electronic circuit, the invention may also be carried out by a memory fabricated as any bistable electronic, magnetic, optical or optoelectronic device with sufficient speed.

Under control of information from the graphics processor 103, the video palette 108, such as a Texas Instruments TMS34070 Video Palette, converts the data received from the data register 107 into video level signals on a bus 125. This conversion is accomplished through a look-up table. The video level signal output from the video palette 108 may include color, saturation, and brightness information.

Digital to video converter 110 receives the digital video signals from the video palette 108 and, under control of signals received by way of the video control bus 116, converts the digital video signals into analog levels which are applied to the video display 112 via an output line 127. The number of pixels per horizontal line and the number of lines per display are determined by the graphics processor 103. Also, the synchronization, retrace, and blanking signals are controlled by the graphics processor 103. Altogether, this group of signals specify the desired video output to the video display 112.

Video display 112 produces the specified video image for viewing by the user. There are two techniques which are used widely. The first technique specifies video data in terms of color, hue, brightness, and saturation for each pixel. For the second technique, color levels of red, blue and green are specified for each pixel. The video palette 108, the digital to video converter 110, and the video display are designed and fabricated to be compatible with the selected technique.

Figure 2:
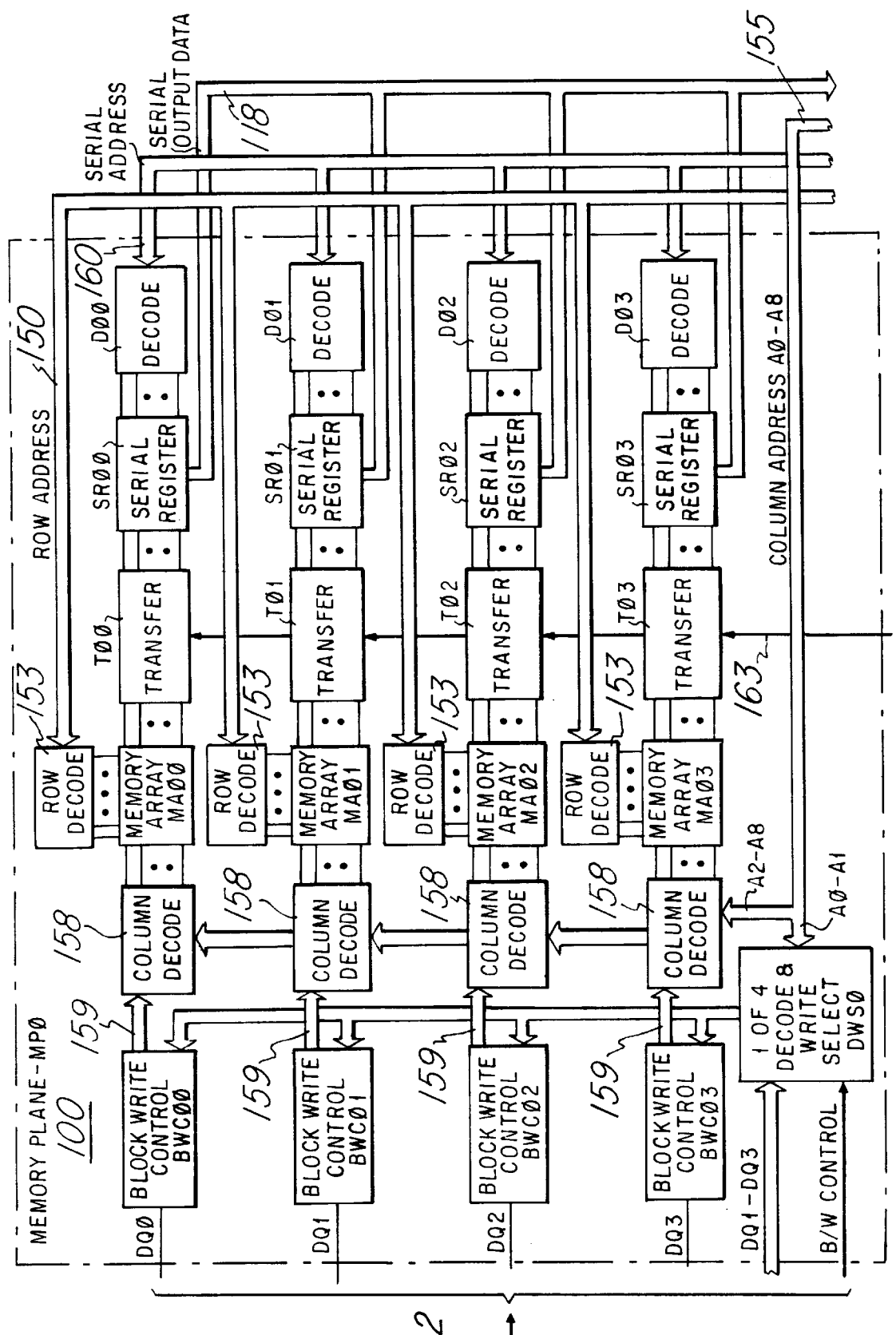
Figure 3:
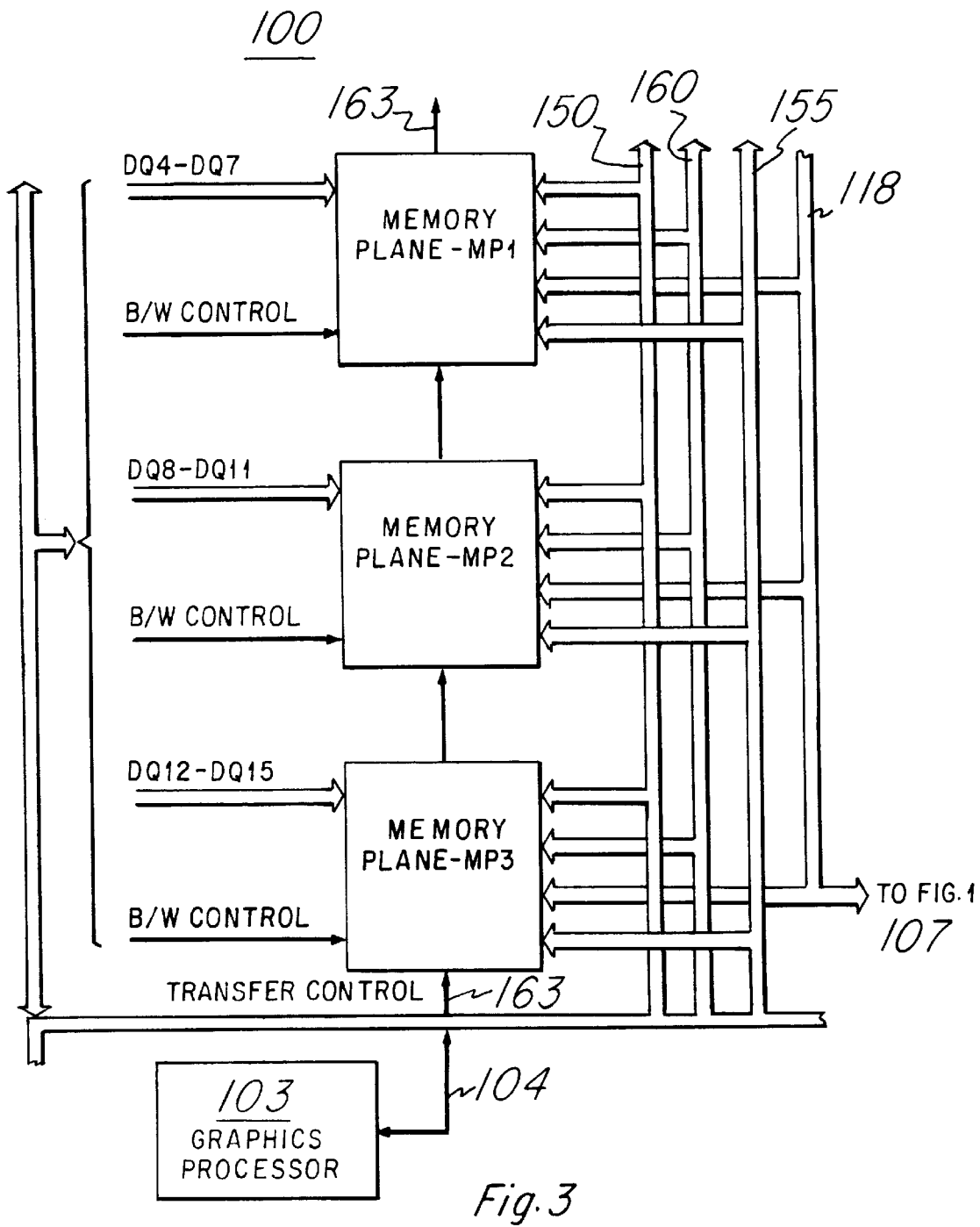

Referring now to FIGS. 2 and 3, a video random access memory (VRAM) 100 includes a group of memory planes MP0, MP1, MP2 and MP3. Although four memory planes are shown by way of example, other numbers of memory planes may be used in practical arrangements. Typically there will be four or more memory planes. The number of memory planes is a power of two, e.g., ($2^n$). For the current state of the art, four memory planes provide a very effective arrangement. For purposes of simplifying the block diagram of FIGS. 2 and 3, only memory plane MP0 is shown in detail. The other three memory planes are similar to memory plane MP0.

Memory plane MP0 includes four memory arrays MA00, MA01, MA02, and MA03. Each memory array includes many storage cells arranged in rows and columns. Individual storage cells typically include a single metal-oxidesemiconductor (MOS) transistor and a capacitor. The storage cells are addressable by row and column addresses. Bit lines extend through the array for writing data into the storage cells and for reading stored data from the storage cells. Word lines also extend through the array for providing a control signal to any storage cell which is selected for either a write-in operation or a read-out operation.

For every write-in and read-out operation, (both random access and serial access), row address information is generated by the graphics processor 103 and is forwarded through a row address bus 150 to a row address register and row address decoder 153, associated with each of the memory arrays MA00, MA01, MA02, and MA03. For exemplary purposes, there are eight bits in each row address carried by an eight bit wide row address bus. The row address information is stored in the row address register until a row address strobe signal $\overline{RAS}$ is applied by the graphics processor to the row address registers for enabling the row address information to be decoded through the row address decoders 153 for simultaneously selecting the same addressed row of storage cells in each of the memory arrays MA00, MA01, MA02, and MA03. For clarity of FIGS. 2 and 3, the row address strobe lead is not shown.

Although FIG. 2 shows a separate row decoder 153 for each memory array, it is clear that row decoding circuitry may be shared among two or more memory arrays because the same row is accessed simultaneously in each of the memory arrays. Thus the row addresses may be decoded in a common row decoder for all of the memory arrays.

Column addressing is more complicated than row addressing because there are several different ways to address the columns of storage cells in the memory arrays. For random access operations (either writing data into or reading data out of selected storage cells), column address information is generated by the graphics processor 103 and is forwarded through a column address bus 155 in a first part, or group of most significant bits, (address bits A2–A8) to a column address register and column address decoder 158, associated with each of the memory arrays MA00, MA01, MA02 and MA03. This group of most significant bits of the column address is stored in the column address register until a column address strobe signal $\overline{CAS}$ is applied by the graphics processor to the column address registers for enabling the column address information to be decoded through the column address decoders 158. A second part of the column address information, or set of least significant bits, (address bits A0–A1) is applied to decode and write select circuit DWS0. The set of least significant bits of the column address information that is applied to the decode and write select circuit DWS0 is processed through that circuit and block write control circuits BWC00, BWC01, BWC02, and BWC03. In response to the column address strobe signal $\overline{CAS}$, the selected column enable signals are applied by way of buses 159, and the column address decoders 158 to the memory arrays MA00, MA01, MA02 and MA03. Operation of the decode and write select circuit DWS0 and the block write control circuits BWC00, BWC01, BWC02, and BWC03 is to be described in greater detail hereinafter with respect to FIGS. 7 and 8.

Although FIG. 2 shows separate column decoder arrangements for each memory array, a common column decoder circuit may be used for selecting columns in two or more of the memory arrays. The same column or block of columns is selected in each of the memory arrays. Thus the column addresses may be decoded in a common column decoder for all of the memory arrays.

Continuing in FIGS. 2 and 3, a data bus, including data lines DQ0–DQ15, interconnects the graphics processor 103 with the memory planes MP0–MP3. Data lines DQ0–DQ3 are connected with the memory plane MP0. In the memory plane MP0, each one of the data lines connects with the input to a different one of the block write control circuits. For example, data line DQ0 connects with the input to the block write control circuit BWC00 for applying data bits being transmitted from the graphics processor 103 to the memory array MA00, or vice versa. Each of the other data lines DQ1–DQ15 is similarly arranged with an associated block write control circuit.

A serial address bus 160 is connected between the graphics processor 103 and the memory planes MP0–MP3. The several leads of the serial address bus 160 are connected in multiple to several serial output address decoders D00–D03. There is a serial output address decoder associated with each of the memory arrays MA00–MA03 of the memory plane MP0.

For serial readout operations, entire rows or partial rows of data bits stored in each of the memory arrays MA00–MA03 are transferred in parallel from their storage locations through transfer gates T00–T03 to several stages of each of the serial registers SR00–SR03, each associated with a memory array having similar numerical digits in its designator. Each of the transfer control gates includes a sufficient number of individual gates for effecting a transfer of a data bit from each column of the memory array into the several stages of the serial register at once. Transfer control signals for operating the transfer gates T00–T03 are generated by the graphics processor 103 and are applied to the transfer gates by way of a transfer control lead 163.

Once the data bits are transferred in parallel to the stages of the serial registers SR00–SR03, they can be serially read out of each of the serial registers SR00–SR03. Such serial readouts from the several serial registers occur simultaneously. The first data bit read out from each serial register is determined by the address information applied by way of the serial address bus 160. Such address is stored in a register within the serial address decoders D00–D03. Subsequent addresses in the sequence are generated by counting circuits within the serial address decoders. The counter state is decoded to enable the stored data bit from the appropriate serial register stage to be read out in sequential order.

The serial output data bits are transmitted from the serial registers SR00–SR03 to the data register 107 of FIG. 1, which receives in parallel data bits from each of the serial register SR00–SR03 of FIG. 2. By way of a parallel-to-serial conversion and a sixteen-to-one speed up in timing in the data register 107 of FIG. 1, the sequence of data is forwarded from the serial registers to the video palette 108 on its way to the digital to video convertor 110 and the video display 112.

Figure 4:
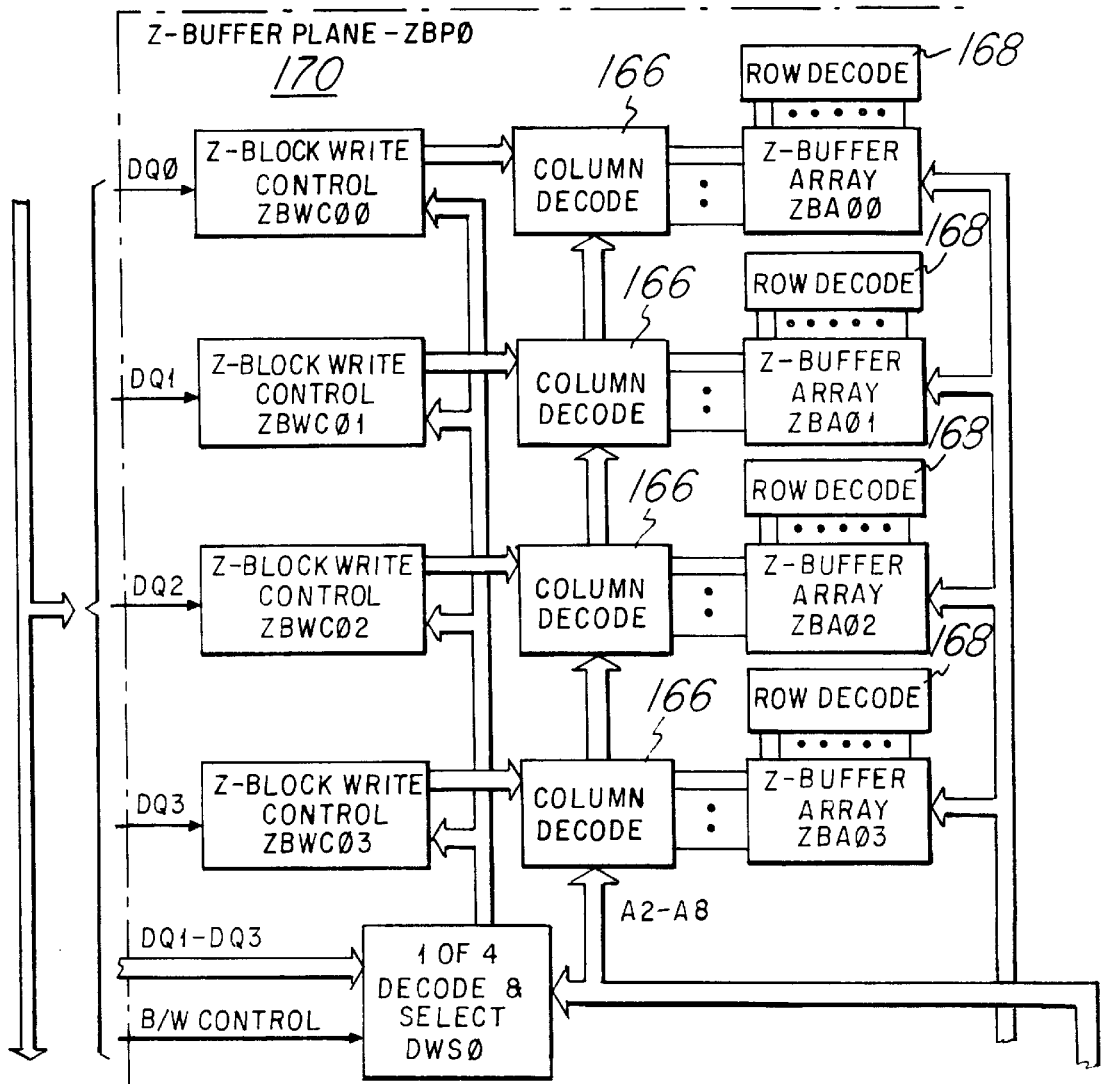

Referring now to FIGS. 4 and 5, a Z-buffer memory 170 includes a group of Z-buffer planes ZBP0, ZBP1, ZBP2 and ZBP3. More Z-buffer planes may be used in any other desired arrangement. Typically a Z-buffer plane may be used in association with each of the memory planes of FIGS. 2 and 3. For purposes of simplifying the block diagram, only Z-buffer plane ZBP0 is shown in detail. The other three are similar to Z-buffer plane ZBP0.

Z-buffer plane ZBP0 includes four Z-buffer arrays ZBA00, ZBA01, ZBA02 and ZBA03. The arrangement of the Z-buffer arrays is similar to the arrangement of the memory arrays described hereinbefore except that the Z-buffer arrays may be either dynamic cells or static cells. Bipolar static cells may be used in the Z-buffer arrays when very rapid access is desired.

Row addressing of the Z-buffer is similar to the row addressing for the video random access memory.

As is readily apparent, the Z-buffer column address decoding for normal write-in and for block write-in is similar to that described for the memory arrays. No provision is made for serial read out from the Z-buffer arrays because the data store therein is just used by the graphics processor 103 on a random access basis. Each bit of data stored in the Z-buffer is located at the same address as the data representing a pixel in the video random access memory 100. The bit in the Z-buffer represents the depth (or Z-axis dimension of a three-dimensional X, Y, Z axis) for the pixel on the display screen. Row and column addresses of the pixel represent the X and Y axes on the display screen.

Figure 7:
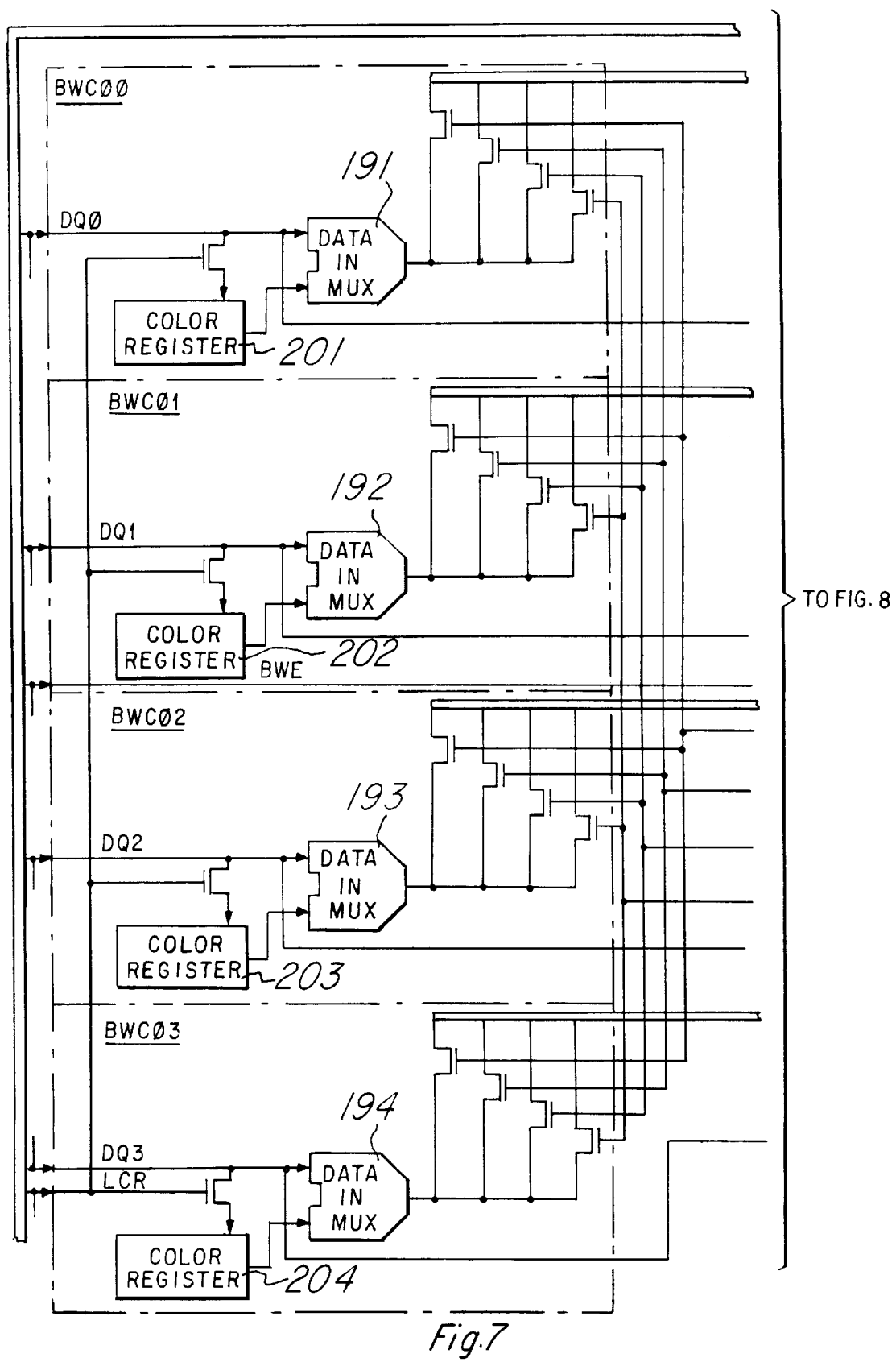
FIGS. 7 and 8 when positioned as shown in FIG. 9 present a block diagram of a random access memory column address decoder arranged with block write control circuits.
Figures 8, 9:
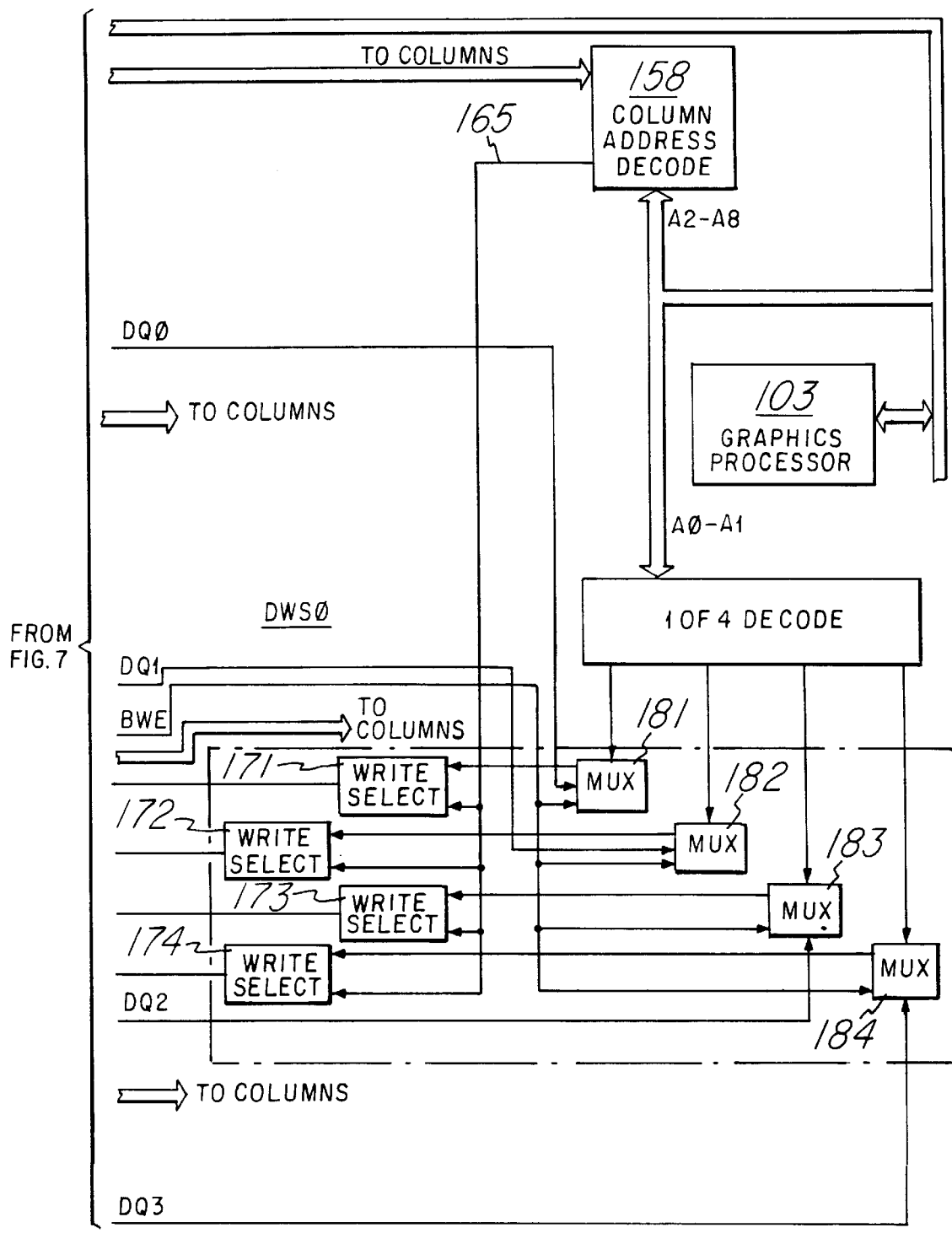

Referring now to FIG. 7, there are shown four block write control circuits BWC00–BWC03 which operate in conjunction with a single decode and write selection circuit DWS0 in the memory plane MP0 of FIG. 2 and the Z-buffer plane ZBP0 of FIG. 8. In FIG. 7, four random access data leads DQ0–DQ3 from the random access data bus are applied, respectively to the block write control circuits BWC00–BWC03, i.e., one data lead to each block write control circuit. In addition from the graphics processor 103 of FIG. 1, there are two be control leads which connect in multiple to the block write control circuits BWC00–BWC03. The arrangement of the block write control circuits and the decode and write selection circuit selectively writes data either from the random data bus or from color registers that store data to be written commonly to several storage locations over a period of many clock cycles. With respect to FIGS. 7 and 8, the following description will be limited mostly to the arrangement and operation of the block write control circuit BWC00 and the decode and write selection circuit DWS0. The other block write control circuits BWC01–BWC03 operate similar to and concurrently with the block write control circuit BWC00.

For a block write operation, a data bit is applied from the data bus lead DQ0 to the input of the block write circuits BWC00 and ZBWC00 for storage in a storage cell located along a selected one-of-four columns associated with the block write circuits BWC00 and ZBWC00. After selecting the desired row, the desired four columns are selected as a group by address from the memory array containing sixty-four groups of similar arrangements. Each address selects a different group of four columns of the memory array and the Z-buffer array. None of the sixty-three other arrangements is shown in FIGS. 7 and 8.

The column address decoder 158 is shown in FIG. 8. It receives address bits A2–A8 for decoding and selecting one of the groups of four columns. Assuming that the applied column address bits select the group of four columns associated with the arrangement of FIG. 7, an enabling signal occurs on lead 165 for simultaneously enabling all four write select circuits 171, 172, 173 and 174. A high block write enable signal BWE enables multiplexers 181, 182, 183 and 184 to apply high level signals to each of the inputs of the write select circuits 171, 172, 173 and 174 for transfer to the block write control circuits BWC00, BWC01, BWC02 and BWC03 (or ZBWC00, ZBWC01, ZBWC02, ZBWC03). Address bits A0-A1 are cut off and have no effect for the block write operation. All four transistor gates may be enabled in each control circuit. The block write operation allows a selection of any subset of four columns in the array. Within plane MP0, the data-in multiplexers 191, 192, 193 and 194, associated with each array, are controlled by an address mask on the data terminals DQ0, DQ1, DQ2 and DQ3 to transfer the stored data contents of the color registers 201, 202, 203 and 204. Thus for each plane a single bit of data, associated with each array within the plane and stored in each color register, is applied through the associated data-in multiplexer, e.g., 191, simultaneously through four enabled transistor gates to selected ones of the columns. This bit of data from the color register is written into the selected ones of the four memory storage cells located at the addressed row intersections with the four addressed columns of the array. The data representing four pixels therefor are written simultaneously into storage cells having the same row address and the selected ones of the four adjacent column addresses in the four memory arrays of the memory plane MP0 and the Z-buffer arrays of the Z-buffer plane ZBP0.

Simultaneously in memory planes MP1, MP2 and MP3, different data from each associated color register are written to selected columns in each memory array under control of separate address masks from different data input terminals associated with memory planes MP1, MP2 and MP3.

Since the data bit written into the memory array or Z-buffer array is stored in the color register, that data bit can be retained for many clock cycles. It is available for a long sequence of block write operations to quickly write into the memory information that represents a large uniform field in the image to be displayed. Once the desired field is written into the memory arrays or the Z-buffer arrays, the data bit in the color register can be changed before another block write operation is commenced for the same or a different area of the desired image.

Figure 10:
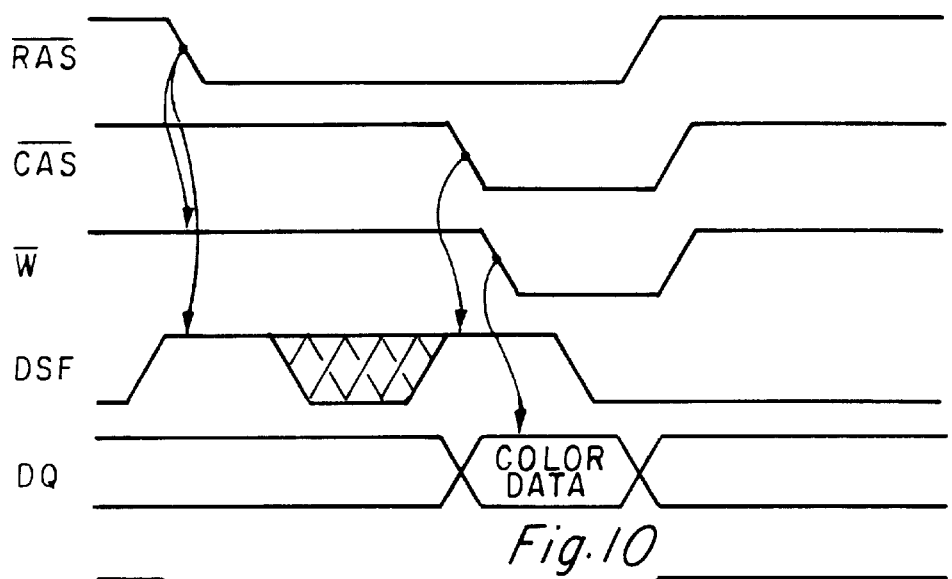
FIGS. 10, 11 and 12 are timing diagrams for operating the circuits of FIGS. 2–5, 7 and 8.

Referring now to FIG. 10, there is shown a timing diagram of control signals from the graphics processor 103, which are used for deriving control signals used by the video random access memory and the Z-buffer memory. A row address strobe signal $\overline{RAS}$, a column address strobe signal $\overline{CAS}$, a write signal $\overline{W}$, a data special function signal DSF, and a data signal DQ are presented. A special function control signal load the color register LCR is specified when the falling edge of the row address strobe signal $\overline{RAS}$ occurs while the write signal $\overline{W}$ and the data special function signal DSF are high. Thereafter valid data is written into the color register upon the falling edge of either the column address strobe signal $\overline{CAS}$ or the write signal $\overline{W}$, which ever one falls last.

Figure 11:
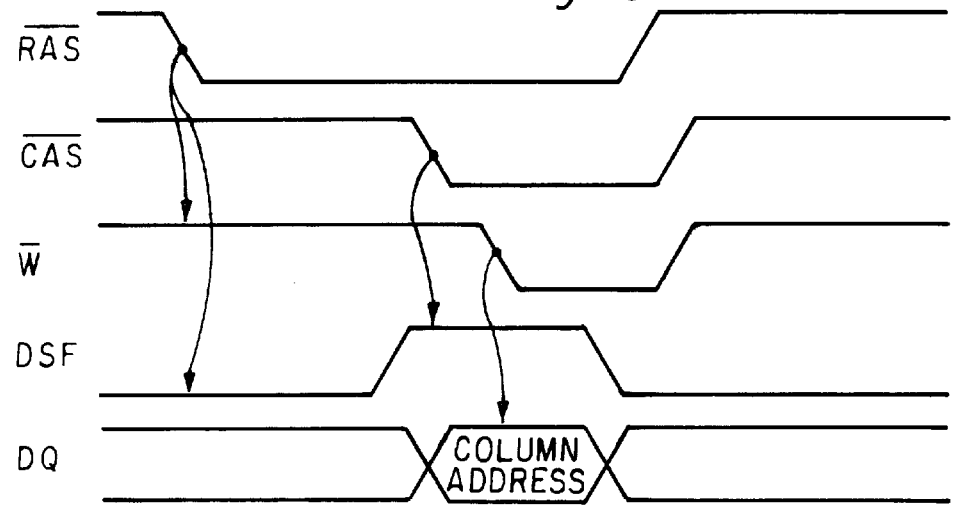

Referring now to FIG. 11, there is shown a timing diagram of other control signals used by the video random access memory and the Z-buffer memory for selecting columns. A load column address register control signal is enabled when the falling edge of the row address strobe signal $\overline{RAS}$ occurs while the write signal is high and the data special function signal is low. Thereafter the falling edge of the column address signal $\overline{CAS}$ occurs while the data special function signal DSF is high followed by the falling edge of the write signal to write the column address into the column address decoder.

Figure 12:
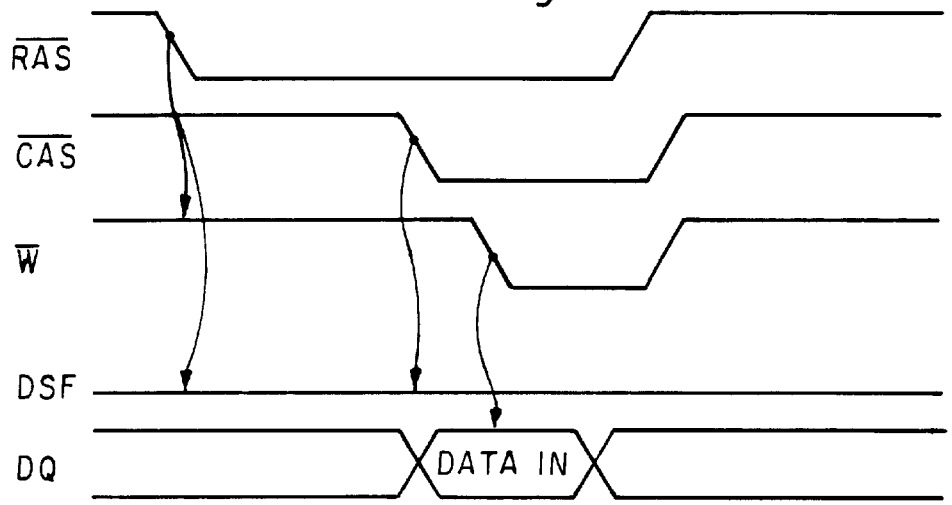

Referring now to FIG. 12, there is shown a timing diagram of further control signals used by the video random access memory and the Z-buffer memory for writing data. A falling edge of the row address strobe signal occurs while the write signal $\overline{W}$ is high and the data special function signal is low. The falling edge of the column address strobe signal $\overline{CAS}$ also occurs while the data special function signal DSF is low. Then data is written by the falling edge of the write signal $\overline{W}$. This produces a block write signal B/W or BWE.

A block of columns signal on the lead 165 of FIG. 8 determines whether or not signals from the multiplexers 181, 182, 183 and 184 pass through the write select circuits 171, 172, 173 and 174. A one-out-of-four code applied to the multiplexers is applied to the write select circuits for normal write operations. A four bit code from the data bus leads DQ0, DQ1, DQ2 and DQ3 is applied to the multiplexers 181, 182, 183 and 184 for a block write operation.

Refer once again to FIGS. 7 and 8. For a regular random access write operation to a single address, data bits are applied to the data input leads DQ0, DQ1, DQ2 and DQ3. The applied row address selects a desired row of storage cells. The applied column address bits A2–A8 are decoded to select a group of four columns, e.g., the columns represented in FIG. 7, and apply a high level signal to enable the four write selection circuits 171, 172, 173 and 174. The two least significant column address bits A0 and A1 are decoded into a one-out-of-four code which is applied to the multiplexers 181, 182, 183 and 184. Those multiplexers consequently provide a one-out-of-four high signal to the write selection circuits. Thus only a single transistor gate is enabled in each of the block write control circuits BWC00, BWC01, BWC02 and BWC03. The data bits being applied on the leads DQ0, DQ1, DQ2 and DQ3 are transmitted through the data-in multiplexers 191, 192, 193 and 194 under control of the data stored in write mask registers. The applied data bits are transmitted through the single enabled transistor gate to a single column in the memory array or the Z-buffer array. As a result the applied data bit is written into a single cell located in the memory array MA00 or the Z-buffer array ZBA00 at the row address intersection with the single selected column. Data representing a single pixel is written all at once into storage cells having the same row and column address in the memory arrays of the memory plane MP0 and storage cells of the Z-buffer plane ZBP0.

Because the serial data output operation from the memory arrays is asynchronous with respect to the random access data input operations, serial data can be transferred out of the memory arrays to the serial registers as needed for presentation of the display image. Data is transferred to the serial register by selected row. A selected row of data from the memory array can be transferred at once into the associated serial register. From each serial register, the data is read out in a sequential stream in parallel with data from all other memory arrays. This data is applied in parallel to the inputs of the register 107 of FIG. 1. That register converts the parallel sequence of data into a serial sequence of pixel data that is forwarded to the video palette 108. Upon interpretation and conversion to video signals on lead 127, the resulting video signals represent the desired pixels to be presented in the image on the video display 112.

An exemplary embodiment of the subject invention has been described. The described embodiment together with other embodiments which are obvious in view thereof are considered to be within the scope of the appended claims.

What is claimed is:

1. A random access memory comprising:
   plural memory planes, each memory plane including:
      N memory arrays;
      N serial registers, each serial register coupled to a memory array;
      N block write control circuits, each block write control circuit coupled to a memory array;
      a row address decoder, coupled to at least one of the memory arrays;
      the random access memory further comprising:
         a column address decoder arranged for both block decoding and individual column decoding, the column address decoder being coupled to at least one of the memory arrays;
         an address bus connecting with all of the memory arrays;
         a data bus connecting with all of the memory arrays; and
         the plural memory planes, the address bus, and the data bus are all fabricated on a single semiconductor substrate.

2. A random access memory, in accordance with claim 1, wherein the memory arrays, each comprises:
   an array of dynamic MOS memory cells arranged in addressable rows and columns;
   a random access data input terminal; and
   a serial access data output terminal.

3. A random access memory, in accordance with claim 2, wherein the memory arrays, each comprises:
   means for receiving control signals to control random write operations and block write operations.

4. A random access memory, in accordance with claim 1, wherein the column address decoder is responsive to the same group of most significant address bits for all of the memory arrays of the plural memory planes and is responsive to sets of different least significant address bits for separate memory arrays of the plural memory planes.

5. A random access memory comprising:
   plural memory planes, each memory plane including:
      N memory arrays;
      N serial registers, each serial register coupled to a memory array;
      N block write control circuits, each block write control circuit coupled to a memory array;
      a row address decoder, coupled to at least one of the memory arrays;
      column address decoders arranged for both block decoding and individual column decoding, each column address decoder being coupled to one of the memory arrays;
      the random access memory further comprising:
         an address bus connecting with all of the memory arrays;
         a data bus connecting with all of the memory arrays; and
         the plural memory planes, the address bus, and the data bus are all fabricated on a single semiconductor substrate.

6. A random access memory, in accordance with claim 5, wherein the memory arrays, each comprises:
   an array of dynamic MOS memory cells arranged in addressable rows and columns;
   a random access data input terminal; and
   a serial access data output terminal.

7. A random access memory, in accordance with claim 6, wherein the memory arrays, each comprises:
   means for receiving control signals to control random write operations and block write operations.

8. A random access memory, in accordance with claim 5, wherein the column address decoders are responsive to the same group of most significant address bits for all of the memory arrays of the plural memory planes and are responsive to sets of different least significant address bits for separate memory arrays of the plural memory planes.

9. A random access memory comprising:
   plural memory planes, each memory plane including:
      N memory arrays;
      N serial registers, each serial register coupled to a memory array;

N block write control circuits, each block write control circuit coupled to a memory array;

the random access memory further comprising:
- a row address decoder, coupled to at least one of the memory arrays;
- a column address decoder arranged for both block decoding and individual column decoding, the column address decoder being coupled to at least one of the memory arrays;
- an address bus connecting with all of the memory arrays;
- a data bus connecting with all of the memory arrays; and
- the plural memory planes, the address bus, and the data bus are all fabricated on a single semiconductor substrate.

10. A random access memory, in accordance with claim 9, wherein the memory arrays, each comprises:
- an array of dynamic MOS memory cells arranged in addressable rows and columns;
- a random access data input terminal; and
- a serial access data output terminal.

11. A random access memory, in accordance with claim 10, wherein the memory arrays, each comprises:
- means for receiving control signals to control random write operations and block write operations.

12. A random access memory, in accordance with claim 9, wherein the column address decoder is responsive to the same group of most significant address bits for all of the memory arrays of the plural memory planes and is responsive to sets of different least significant address bits for separate memory arrays of the plural memory planes.

* * * * *